(12) United States Patent
Chen et al.

(10) Patent No.: US 10,015,888 B2
(45) Date of Patent: Jul. 3, 2018

(54) INTERCONNECT JOINT PROTECTIVE LAYER APPARATUS AND METHOD

(71) Applicant: Taiwan Semiconductor Manufacturing Company, Ltd., Hsin-Chu (TW)

(72) Inventors: Cheng-Ting Chen, Taichung (TW); Hsuan-Ting Kuo, Taichung (TW); Hsien-Wei Chen, Hsin-Chu (TW); Wen-Hsiung Lu, Jhonghe (TW); Ming-Da Cheng, Jhubei (TW); Chung-Shi Liu, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 21 days.

(21) Appl. No.: 13/913,599

(22) Filed: Jun. 10, 2013

(65) Prior Publication Data

US 2014/0231125 A1 Aug. 21, 2014

Related U.S. Application Data

(60) Provisional application No. 61/765,322, filed on Feb. 15, 2013.

(51) Int. Cl.
*H05K 3/28* (2006.01)
*H05K 3/40* (2006.01)
(Continued)

(52) U.S. Cl.
CPC ............ *H05K 3/281* (2013.01); *H01L 21/566* (2013.01); *H01L 23/3192* (2013.01);
(Continued)

(58) Field of Classification Search
CPC .......... H05K 3/4007; H05K 1/11; H05K 3/34; H05K 3/281; Y10T 29/49158;
(Continued)

(56) References Cited

U.S. PATENT DOCUMENTS 5,072,520 A 12/1991 Nelson
5,317,801 A * 6/1994 Tanaka ................ H01L 21/4853
216/17

(Continued)

FOREIGN PATENT DOCUMENTS

DE 102005040213 A1 3/2006
DE 112005001949 T5 5/2007
(Continued)

*Primary Examiner* — Peter DungBa Vo
*Assistant Examiner* — Kaying Kue
(74) *Attorney, Agent, or Firm* — Slater Matsil, LLP

(57) ABSTRACT

Disclosed herein is a mechanism for forming an interconnect comprising forming a connector on an interconnect disposed on a first surface of a first substrate and applying a nonconductive material in a non-liquid form over the interconnect after forming the connector. The nonconductive material covers at least a lower portion of the interconnect, and at least a portion of the interconnect is exposed. The nonconductive material is formed around the connector by pressing the nonconductive material over the connector with a roller. An angle between a top surface of the nonconductive material and a connector sidewall between about 65 degrees and about 135 degrees. The nonconductive material may be formed to extend under the connector.

20 Claims, 6 Drawing Sheets

(51) Int. Cl.
  *H01L 23/31* (2006.01)
  *H01L 21/56* (2006.01)
  *H01L 23/00* (2006.01)

(52) U.S. Cl.
  CPC .............. *H01L 24/11* (2013.01); *H01L 24/13* (2013.01); *H01L 24/16* (2013.01); *H01L 24/81* (2013.01); *H01L 2224/0345* (2013.01); *H01L 2224/0401* (2013.01); *H01L 2224/05548* (2013.01); *H01L 2224/05567* (2013.01); *H01L 2224/05569* (2013.01); *H01L 2224/05624* (2013.01); *H01L 2224/05644* (2013.01); *H01L 2224/05647* (2013.01); *H01L 2224/05681* (2013.01); *H01L 2224/05684* (2013.01); *H01L 2224/1134* (2013.01); *H01L 2224/1191* (2013.01); *H01L 2224/11849* (2013.01); *H01L 2224/131* (2013.01); *H01L 2224/133* (2013.01); *H01L 2224/13006* (2013.01); *H01L 2224/13022* (2013.01); *H01L 2224/13023* (2013.01); *H01L 2224/13024* (2013.01); *H01L 2224/1329* (2013.01); *H01L 2224/13111* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13184* (2013.01); *H01L 2224/16238* (2013.01); *H01L 2224/73204* (2013.01); *H01L 2224/81191* (2013.01); *H01L 2224/81815* (2013.01); *H05K 3/4007* (2013.01); *Y10T 29/49147* (2015.01)

(58) Field of Classification Search
  CPC ......... Y10T 29/49204; Y10T 29/49147; H01L 23/3192; H01L 21/566; H01L 24/11
  USPC ................... 29/874, 846–853; 174/261–267
  See application file for complete search history.

(56) References Cited

U.S. PATENT DOCUMENTS

| | | | |
|---|---|---|---|
| 5,869,904 A | 2/1999 | Shoji | |
| 6,037,065 A | 3/2000 | Hajmrle et al. | |
| 6,158,644 A | 12/2000 | Brofman et al. | |
| 6,187,615 B1 | 2/2001 | Kim et al. | |
| 6,365,978 B1 | 4/2002 | Ibnabdeljalil et al. | |
| 6,369,451 B2 | 4/2002 | Lin | |
| 6,425,516 B1 | 7/2002 | Iwatsu et al. | |
| 6,586,322 B1 | 7/2003 | Chiu et al. | |
| 6,589,870 B1* | 7/2003 | Katoh | H05K 3/4647 438/690 |
| 6,643,923 B1* | 11/2003 | Hishinuma | H01L 21/4853 174/267 |
| 6,664,637 B2 | 12/2003 | Jimarez et al. | |
| 6,933,613 B2 | 8/2005 | Akashi | |
| 6,940,169 B2 | 9/2005 | Jin et al. | |
| 7,187,068 B2 | 3/2007 | Suh et al. | |
| 7,372,151 B1 | 5/2008 | Fan et al. | |
| 7,749,882 B2 | 7/2010 | Kweon et al. | |
| 7,977,783 B1 | 7/2011 | Park et al. | |
| 8,264,089 B2 | 9/2012 | Alvarado et al. | |
| 8,345,435 B2* | 1/2013 | Hamatani | H01L 21/6835 174/250 |
| 8,362,612 B1 | 1/2013 | Paek et al. | |
| 8,624,392 B2 | 1/2014 | Yew et al. | |
| 8,735,273 B2 | 5/2014 | Lu et al. | |
| 9,257,333 B2* | 2/2016 | Lu | H01L 21/76885 |
| 9,263,839 B2* | 2/2016 | Chen | H01L 24/11 |
| 9,437,564 B2 | 9/2016 | Lu et al. | |
| 9,607,921 B2 | 3/2017 | Lu et al. | |
| 2001/0050434 A1* | 12/2001 | Kaneda | H05K 3/4007 257/738 |
| 2002/0001937 A1* | 1/2002 | Kikuchi | H01L 21/4857 438/618 |
| 2002/0031868 A1 | 3/2002 | Capote et al. | |
| 2002/0167077 A1 | 11/2002 | Vincent | |
| 2002/0175409 A1 | 11/2002 | Tsubosaki | |
| 2002/0185721 A1 | 12/2002 | Hwang et al. | |
| 2003/0068847 A1 | 4/2003 | Watanabe et al. | |
| 2003/0096453 A1 | 5/2003 | Wang et al. | |
| 2003/0153172 A1 | 8/2003 | Yajima et al. | |
| 2004/0012930 A1 | 1/2004 | Grigg | |
| 2004/0027788 A1 | 2/2004 | Chiu et al. | |
| 2004/0043675 A1* | 3/2004 | Hiatt | H01L 23/3114 439/894 |
| 2004/0072387 A1 | 4/2004 | Hong et al. | |
| 2004/0266162 A1 | 12/2004 | Feng | |
| 2005/0080956 A1 | 4/2005 | Zaudtke et al. | |
| 2006/0038291 A1 | 2/2006 | Chung et al. | |
| 2006/0063378 A1 | 3/2006 | Lin et al. | |
| 2006/0189114 A1 | 8/2006 | Seto et al. | |
| 2007/0045840 A1 | 3/2007 | Varnau | |
| 2007/0102815 A1 | 5/2007 | Kaufmann et al. | |
| 2007/0108573 A1 | 5/2007 | Chung et al. | |
| 2007/0176290 A1 | 8/2007 | Park et al. | |
| 2007/0184577 A1 | 8/2007 | Chung et al. | |
| 2007/0187825 A1 | 8/2007 | Hashimoto | |
| 2007/0267745 A1 | 11/2007 | Chao et al. | |
| 2008/0001290 A1 | 1/2008 | Chou et al. | |
| 2008/0150134 A1 | 6/2008 | Shinkai et al. | |
| 2008/0308935 A1 | 12/2008 | Kim et al. | |
| 2009/0020864 A1 | 1/2009 | Pu et al. | |
| 2009/0045511 A1 | 2/2009 | Meyer et al. | |
| 2009/0045513 A1 | 2/2009 | Kim et al. | |
| 2009/0052218 A1 | 2/2009 | Kang | |
| 2009/0120215 A1 | 5/2009 | Jacobson et al. | |
| 2009/0130840 A1 | 5/2009 | Wang et al. | |
| 2009/0140442 A1 | 6/2009 | Lin | |
| 2009/0140942 A1 | 6/2009 | Mikkola et al. | |
| 2009/0146317 A1 | 6/2009 | Shih | |
| 2009/0206479 A1 | 8/2009 | Daubenspeck et al. | |
| 2009/0294949 A1 | 12/2009 | Meyer | |
| 2009/0314519 A1* | 12/2009 | Soto | H01L 21/4857 174/250 |
| 2010/0065966 A1 | 3/2010 | Pendse et al. | |
| 2010/0078772 A1 | 4/2010 | Robinson | |
| 2010/0096754 A1 | 4/2010 | Lee et al. | |
| 2010/0140760 A1 | 6/2010 | Tam et al. | |
| 2010/0308449 A1 | 12/2010 | Yang et al. | |
| 2011/0037158 A1 | 2/2011 | Youn et al. | |
| 2011/0080713 A1 | 4/2011 | Sunohara | |
| 2011/0101520 A1 | 5/2011 | Liu et al. | |
| 2011/0108983 A1 | 5/2011 | Lu et al. | |
| 2011/0278739 A1 | 11/2011 | Lai et al. | |
| 2011/0285008 A1 | 11/2011 | Nakano | |
| 2012/0006592 A1 | 1/2012 | Ouchi et al. | |
| 2012/0199959 A1 | 8/2012 | Hart et al. | |
| 2012/0199991 A1 | 8/2012 | Okamoto et al. | |
| 2012/0208321 A1* | 8/2012 | Foote | H01L 24/11 438/115 |
| 2012/0211884 A1 | 8/2012 | Stepniak et al. | |
| 2012/0261817 A1 | 10/2012 | Do et al. | |
| 2013/0009307 A1 | 1/2013 | Lu et al. | |
| 2013/0105971 A1 | 5/2013 | Daubenspeck et al. | |
| 2013/0147031 A1 | 6/2013 | Chen et al. | |
| 2013/0168850 A1 | 7/2013 | Samoilov et al. | |
| 2013/0181338 A1 | 7/2013 | Lu et al. | |
| 2014/0054764 A1 | 2/2014 | Lu et al. | |
| 2014/0077361 A1 | 3/2014 | Lin et al. | |
| 2014/0159223 A1 | 6/2014 | Chen et al. | |
| 2014/0175639 A1 | 6/2014 | Kim et al. | |
| 2014/0187103 A1 | 7/2014 | Chen et al. | |
| 2014/0232017 A1 | 8/2014 | Rampley et al. | |
| 2015/0123269 A1 | 5/2015 | Chen et al. | |
| 2015/0137352 A1 | 5/2015 | Chen et al. | |
| 2015/0214145 A1 | 7/2015 | Lu et al. | |
| 2015/0235977 A1 | 8/2015 | Shao et al. | |
| 2015/0243613 A1 | 8/2015 | Chen et al. | |
| 2015/0249066 A1 | 9/2015 | Lin et al. | |

(56) References Cited

U.S. PATENT DOCUMENTS

2015/0262948 A1    9/2015   Lu et al.
2016/0133482 A1    5/2016   Chen et al.
2016/0218090 A1    7/2016   Yu et al.

FOREIGN PATENT DOCUMENTS

| KR | 1020070076846 | 7/2007 |
| KR | 20090018442 A | 2/2009 |
| KR | 20090120215 A | 11/2009 |
| KR | 20100131180 A | 12/2010 |
| TW | 201246540 A | 11/2012 |

* cited by examiner

INTERCONNECT JOINT PROTECTIVE LAYER APPARATUS AND METHOD

REFERENCE TO RELATED APPLICATIONS

This application relates to the following co-pending and commonly assigned patent applications: Ser. No. 13/349,405, filed Jan. 12, 2012, entitled "Package on Package Interconnect Structure;" Ser. No. 13/751,289, filed Jan. 28, 2013, entitled "System and Method for an Improved Fine Pitch Joint;" Ser. No. 13/838,748, filed Mar. 15, 2013, entitled "Interconnect Structures and Methods of Forming Same;" Ser. No. 13/868,554, filed Apr. 23, 2013, entitled "Apparatus and Method for Wafer Separation;" Ser. No. 13/914,426, filed Jun. 10, 2013, entitled "Interconnect Structures and Methods of Forming Same;" Ser. No. 13/934,562, filed Jul. 3, 2013, entitled "Packaging Devices, Methods of Manufacture Thereof, and Packaging Methods" and Ser. No. 13/939,966, filed Jul. 11, 2013, entitled "Apparatus and Method for Package Reinforcement."

The present application claims priority to U.S. Provisional Application Ser. No. 61/765,322, entitled "Interconnect Joint Protective Layer Apparatus and Method," filed on Feb. 15, 2013, which application is hereby incorporated by reference herein in its entirety.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past.

Solder ball grid arrays are a technique sometimes used to join substrate, dies or packages, with an array of solder balls deposited on the bonding pads of a first substrate, and with a second substrate, die or package joined at its own bonding pad sites to the first pad via the solder balls. Solder balls may be formed on a pad as liquid solder, and then solidified for additional processing. The environment with the solder balls is subsequently heated to melt the solder balls and the packages compressed to cause the solder balls to contact the upper and lower pads.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to illustrate the relevant aspects of the embodiments and are not necessarily drawn to scale.

DETAILED DESCRIPTION

The making and using of the presented embodiments are discussed in detail below. It should be appreciated, however, that the present disclosure provides many applicable concepts that can be embodied in a wide variety of specific contexts. The specific embodiments discussed are merely illustrative of specific ways to make and use the described conductive wafer level chip scale package (WLCSP) interconnect or joint (an "interconnect"), and do not limit the scope of the disclosure.

Embodiments will be described with respect to a specific context, namely making and using interconnects useful in, for example, WLCSP assemblies. Other embodiments may also be applied, however, to other electrically connected components, including, but not limited to, package-on-package assemblies, die-to-die assemblies, wafer-to-wafer assemblies, die-to-substrate assemblies, in assembling packaging, in processing substrates, interposers, substrates, or the like, or mounting input components, boards, dies or other components, or for connection packaging or mounting combinations of any type of integrated circuit or electrical component.

The embodiments of the present disclosure are described with reference to FIGS. 1 through 11, and variations of the embodiments are also discussed. Throughout the various views and illustrative embodiments of the present disclosure, like reference numbers are used to designate like elements. Additionally, the drawings are intended to be illustrative, are not to scale and not intended to be limiting. Note that, for simplification, not all element numbers are included in each subsequent drawing. Rather, the element numbers most pertinent to the description of each drawing are included in each of the drawings.

Figure 1:
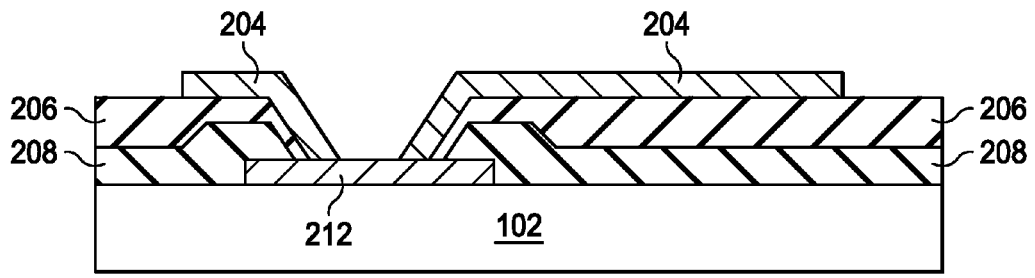
FIGS. 1 through 7 illustrate cross-sectional views of intermediate steps in forming an interconnect according to an embodiment.

FIG. 1 is a cross-sectional view illustrating a substrate 102 with post-passivation interconnect (PPI) 204 according to an embodiment. A PPI 204 may be disposed over a substrate 102 such as a wafer, chip, die, package or other carrier. While one substrate 102 is shown in the drawings, several substrates 102 may optionally be processed on a workpiece, and the workpiece may be singulated during a subsequent process step. The substrate 102 may have one or more finishing layers such as a first passivation layer 208 and a second passivation layer 206 such as a polyimide or dielectric disposed thereon. Additionally, while not shown, the substrate 102 may also have one or more interlayer dielectric layers, intermetal layers, insulator layers, redistribution layers or any other suitable substrate processing layer. The PPI 204 may be electrically connected to a contact pad 212, through via, land, or the like, and may be disposed on, or formed as part of, a metal layer, or the like. The PPI 204 may extend horizontally from the contact pad 212, and the contact pad 212 may be disposed below the mounting pad. In an embodiment, the PPI 204 is formed on the first insulating layer and extend through the second passivation layer 206 and the first passivation layer 208 to contact the contact pad 212.

In an embodiment, the PPI 204 is copper (Cu), but may in other embodiments, may be polysilicon, gold (Au), aluminum (Al), tantalum (Ta), tungsten (W), or any other suitable conductive material or compound. A copper PPI 204 may be formed using photolithography and deposition processes such as plasma enhanced chemical vapor deposition (PECVD), physical vapor deposition (PVD), or another deposition process.

Figure 2:
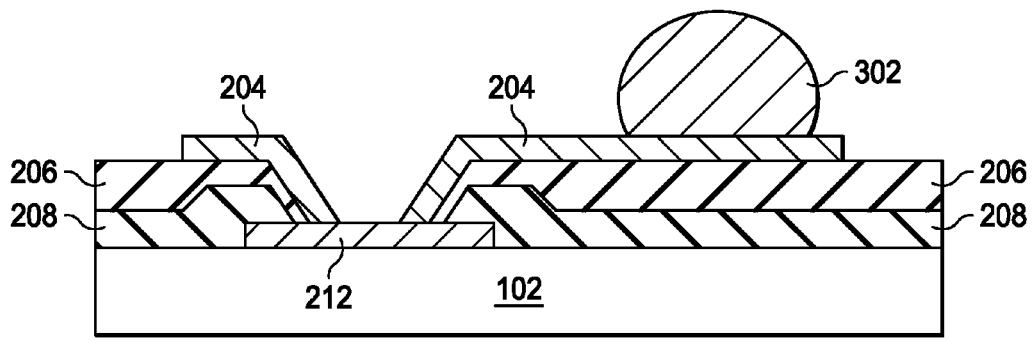

FIG. 2 is a cross-sectional view illustrating application of a conductive connector 302 to the PPI 204. In an embodiment, the connector 302 is a metal such as solder, but may also be another metal, such as gold (Au), aluminum (Al), lead (Pb), silver (Ag), tungsten (W), tin (Sn), or another metal or alloy. The connector 302 may have a ball shape, but may be a pillar, stud, wire, or the like. In another embodiment, the connector 302 is a conductive material such as solder paste, a conductive epoxy or polymer. The connector 302 may also be applied to a mounting surface of the PPI 204 so that the connector 302 avoids the contact pad 212, or is adjacent to, and non-aligned with, the contact pad 212.

The shape of a connector 302 may be controlled to prevent slumping, or widening of the connector 302 during processing. For example, in an embodiment, the connector 302 is metal. The metal may be deposited or applied, and then reflowed in a later step when a second substrate such as a top package is applied. Reflowing the metal may cause the metal to settle, or slump in a softened or liquid state. Such slumping may cause the metal to widen. In a fine pitch arrangement, even a small widening of metal balls may cause bridging between adjacent metal balls, shorting out the bridged conductive joints. Thus, controlling the shape of a connector 302 may permit a finer pitch, or a smaller spacing between adjacent interconnects, without bridging.

Figure 3:
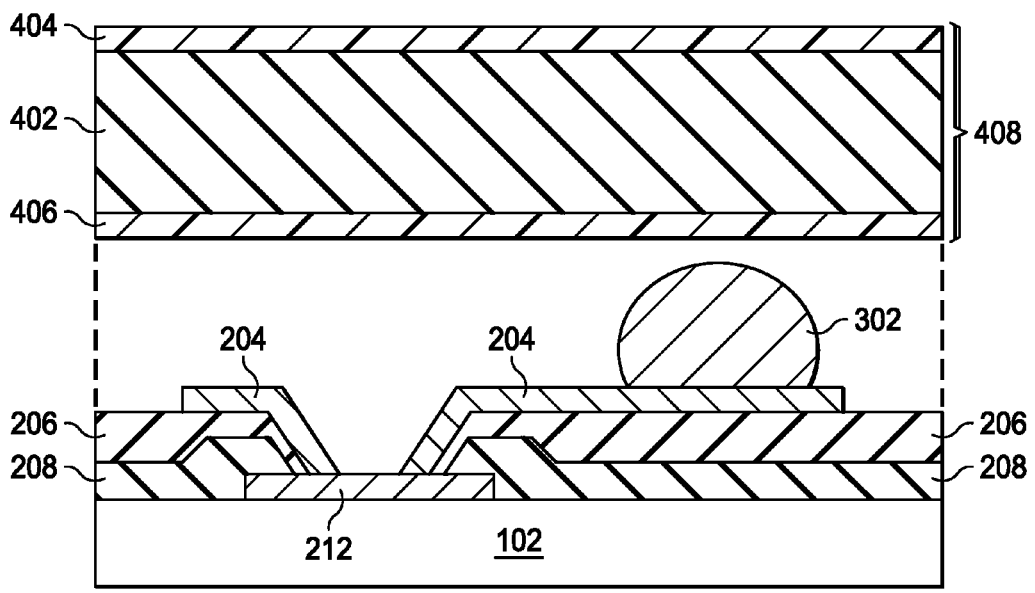

FIG. 3 is a cross-sectional view illustrating application of a nonconductive film (NCF) 402. In one embodiment, the NCF 402 may be a nonconductive material, such as a polymer, a resin, insulator, or the like. The NCF 402 may be a non-liquid material such as a film, sheet or other structure that may be applied to cover and protect at least a portion of the connector 302 and to provide lateral support to the connector 302 during reflow. The NCF 402 may have one or more layers of material applied individually, or in one or more groups. In an embodiment, the NCF 402 is a thermal set polymer or dry film having an adhesive on a side and adheres to the PPI 204 when applied. For example, the NCF 402 may be an epoxy that is cured using thermal energy, or a material that cures when exposed to light, UV, air or a catalyst. In another embodiment, the NCF 402 has a non-adhesive dry film layer and an adhesive layer. In such an embodiment, the adhesive layer is applied over the PPI 204 and the dry film layer may be applied over the adhesive layer, with the adhesive layer attaching the dry film layer to the PPI 204. In another embodiment, the NCF 402 is a non-adhesive dry film that is applied over the PPI 204 and activated or cured using an external process such as a thermal compression bonding (TCB) process, UV curing, solvent, or the like.

In an embodiment, the release layer 404 prevents the NCF 402 from adhering to the roller 502 (See FIG. 5) when the NCF 402 is formed over features on the substrate 102. The NCF may be part of a film stack 408, with the NCF 402 disposed on a base layer 406, and the release layer 404 disposed on the NCF 402. The release layer 404 may, for example be ethylene tetrafluoroethylene (ETFE), polytetrafluoroethylene (PTFE), or the like, or a combination thereof.

Figure 4:
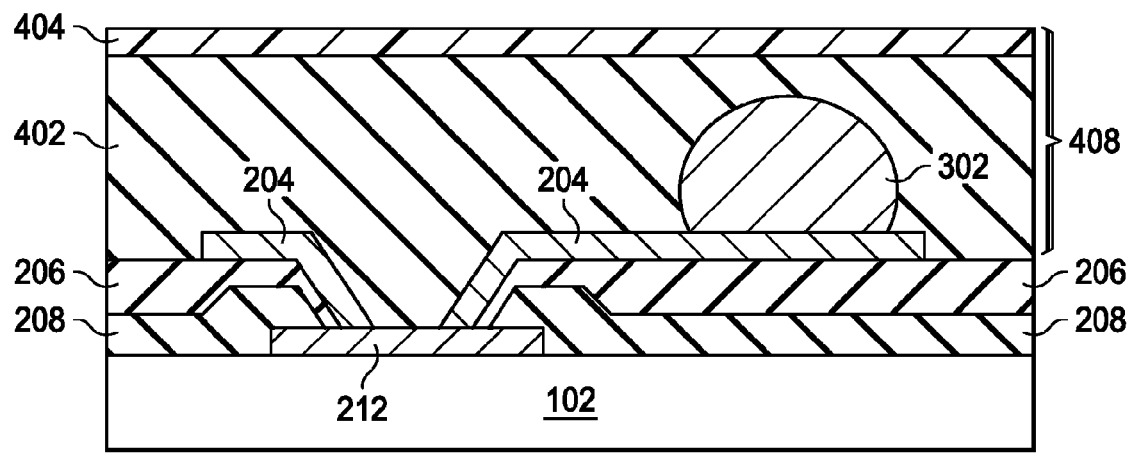

FIG. 4 is a cross-sectional view illustrating application of an NCF 402 having a release layer 404 and carried on a base layer 406. In an embodiment, the NCF 402 has a thickness sufficient to cover the connector 302 structure while forming the NCF 402 around the connector 302. For example, in an embodiment, the NCF 402 has a thickness between about 200 µm and about 500 µm, and the release layer 404 has a thickness between about 10 µm and about 100 µm.

In an embodiment, the NCF 402 has a thickness less than the height of the connector 302, with the release layer 404 having a thickness sufficient to extend above the connector 302 such that film stack 408 extends above the connector 302, and the release layer 404 contours over the upper portion of the connector when the NCF 402 is pressed around the connector 302.

The base layer 406 may be a carrier layer such as a backing film, or the like, for the NCF 402, or may act as a protective layer for the NCF 402 during handling and application. For example, a the film stack 408 may be may be a tape type packaging, with the base layer 406 acting as a backing to permit the NCF 402 and release layer 404 to be applied over the substrate 102. The base layer 406 is removed as the film stack 408 is applied, with the NCF 402 contacting the PPI 204 and other exposed layers. The film stack 408 may be applied over the substrate 102 and then trimmed so that excess material is removed prior to subsequent processing.

Figure 4A:
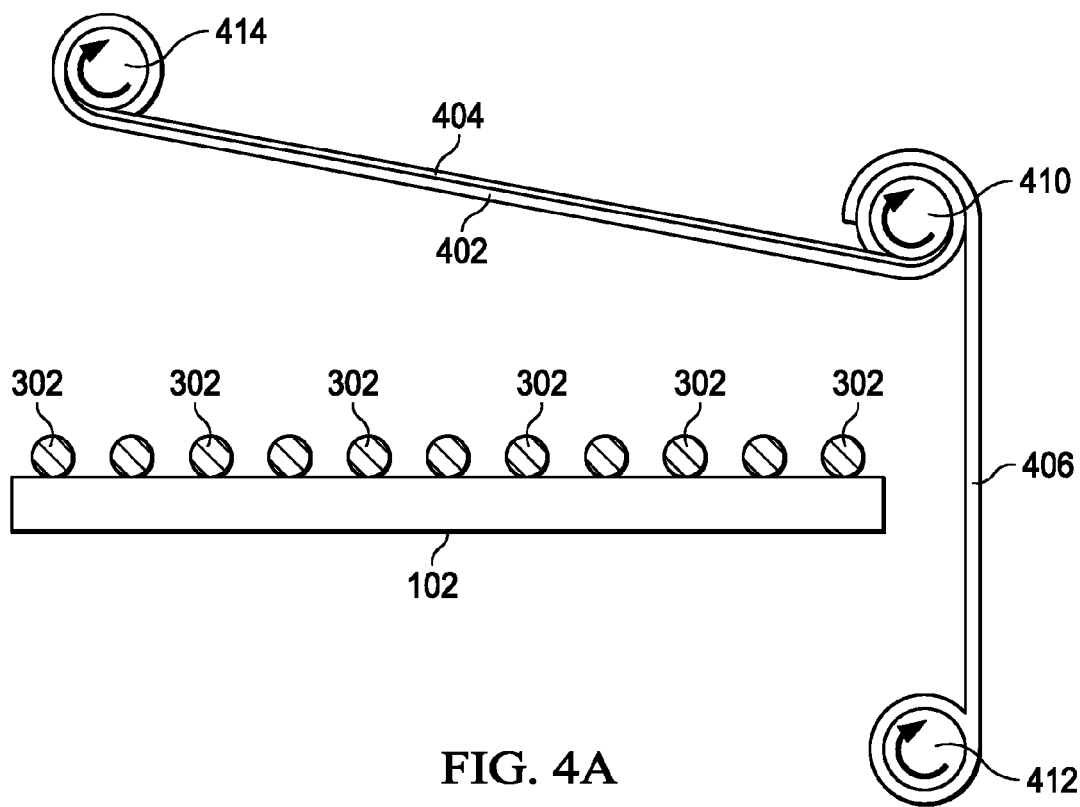

FIG. 4A illustrates an embodiment of a system for applying the NCF 402 over the connectors 302. In such an embodiment, a supply roller 410 holds the film stack 408, and a placement member 424, such as for example, a roller, clip or other mechanism, supports a free end of the NCF 402 and release layer 404 during application. A base roller 412 may be positioned to peel the base layer 406 from the surface of the NCF 402 as the NCF 402 is unrolled from the supply roller 410. The NCF 402 and release layer 404 are placed over the connectors 302 and substrate 102 before separating the NCF 402 and release layer 404 from the supply roller 410 while the base film 406 is retained on the base roller 412.

Figure 5:
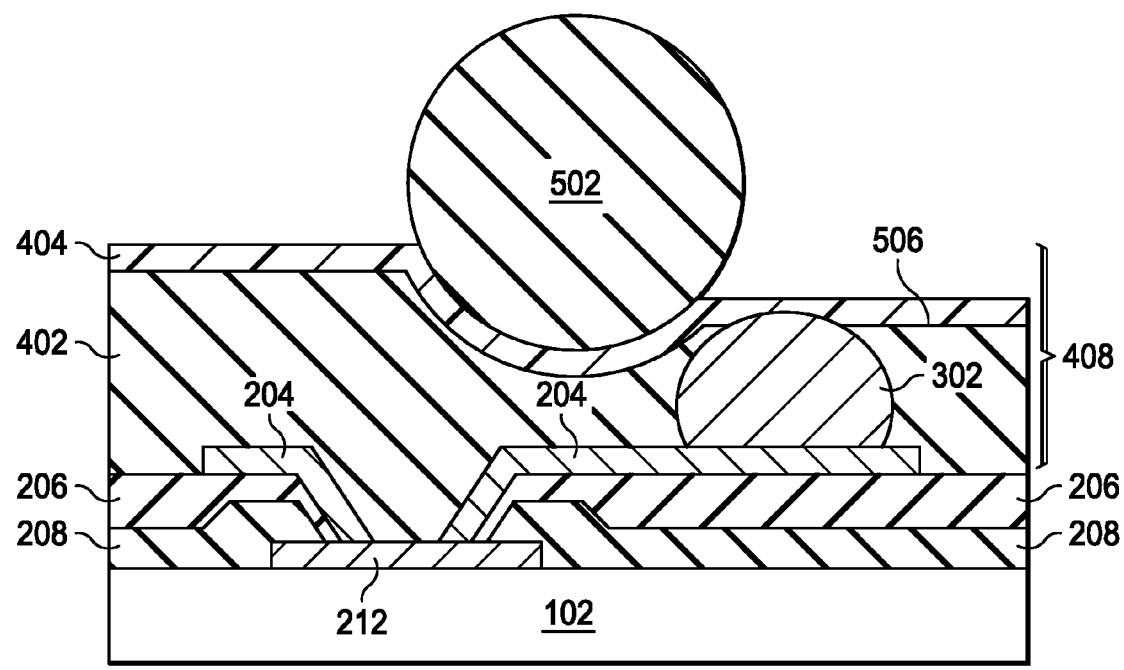

FIG. 5 is a cross-sectional view illustrating forming the NCF 402 with a roller 502. The NCF 402 may be pressed, molded or formed around the connector 302 so that a portion of the connector 302 is exposed for mounting of other structures in subsequent steps.

In an embodiment, the roller 502 compresses the NCF 402 to force the NCF 402 into openings and recesses, and will press out voids, air pockets, or the like, between the NCF 402, the connector 302 and the PPI 204. The material of the NCF 402 may be selected have a viscosity where pressure from the roller 502 will press out any voids or air pockets while forcing the NCF 402 material into the features of the structures disposed on the substrate 102. For example, in an embodiment, the NCF 402 is formed into, or pressed under, the overhang created by a round connector 302, avoiding air pockets at the interface between the connector 302 and the PPI 204.

In an embodiment, the roller 502 has a diameter of about 350 mm and applies a pressure of about 30 N. In an embodiment, the roller 502 moves across the NCF 402 with a rolling speed of about 10 mm/s, and in an embodiment, the roller 502. In an embodiment, the environment around the NCF 402 may be held at about 50° C. The roller 502 rolls the NCF 402 a single time in an embodiment, or may roll the NCF 402 multiple times in other embodiments.

In another embodiment, the NCF 402 may be formed over the PPI 204 and around the connector 302 by molding the NCF 402 using a mold such as a pressure plate or the like. For example, the NCF 402 may be formed by compressing the top surface of the NCF 402 with a rigid or flexible surface. In another example, the NCF 402 may be formed using an air pressure molding technique, creating a positive pressure environment above the NCF 402, forcing the NCF 402 against the PPI 204 and around the connector 302. Alternatively, the NCF 402 may be formed with, for example, a flexible mold pressurized pneumatically or hydraulically to contact the NCF 402 and form the NCF 402 around the connector 302.

In another embodiment, the NCF 402 may be applied to the PPI 204 in a single application and forming step. For example, the NCF 402 may be disposed on a surface of the roller 502 and applied to the PPI 204 by pressing the roller 502 on the PPI 204 to apply and form the NCF 402 simultaneously. In another example, the NCF 402 may be supported at the edges and stretched laterally during application of the NCF 402 to permit the NCF 402 to be pressed onto the PPI 204. The NCF 402 may also be substantially solid, without openings and may stretch over the connector 302. In another embodiment, the NCF 402 may have one or more perforations or recesses to accept the connector 302, so that the NCF 402 may be formed over the connector 302 and onto the PPI 204 with little distortion in the NCF 402.

In an embodiment, forming the NCF 402 may force the NCF 402 off and around the connector 302, resulting in an upper portion of the connector 302 being exposed above the NCF top surface 506. Molding the NCF 402 may also form the NCF 402 with a substantially level or flat NCF top surface 506 and a curved, non-flat or non-linear surface in contact with the connector 302. The shape of the connector 302 may conform to the sides of the NCF 402.

Figure 6:
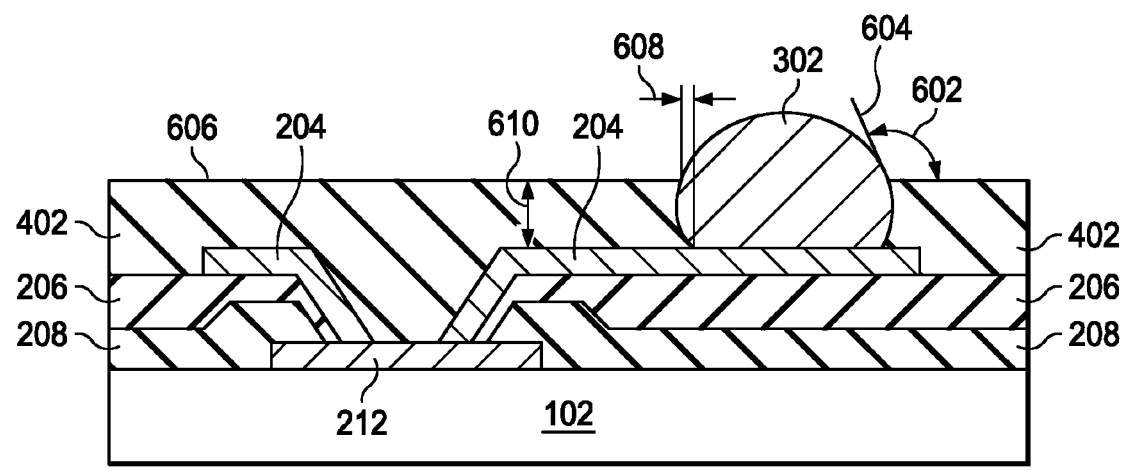

FIG. 6 is a cross-sectional view illustrating a formed NCF 402. The NCF 402 may be cured, and any applied release layer 404 removed. In an embodiment, the NCF 402 is an ultraviolet (UV) cured polymer or has a curing adhesive. In another embodiment, curing the NCF 402 includes cooling a thermal compression bonded NCF 402, or the drying the NCF 402 in embodiments where a liquid curing medium such as a solvent or catalyst is used. The optional use of the release layer 404 permits removal of the roller 502 from the NCF 402, and, in an embodiment where the NCF 402 has an adhesive, may prevent the NCF 402 material from adhering to the roller 502 surface.

Figure 7:
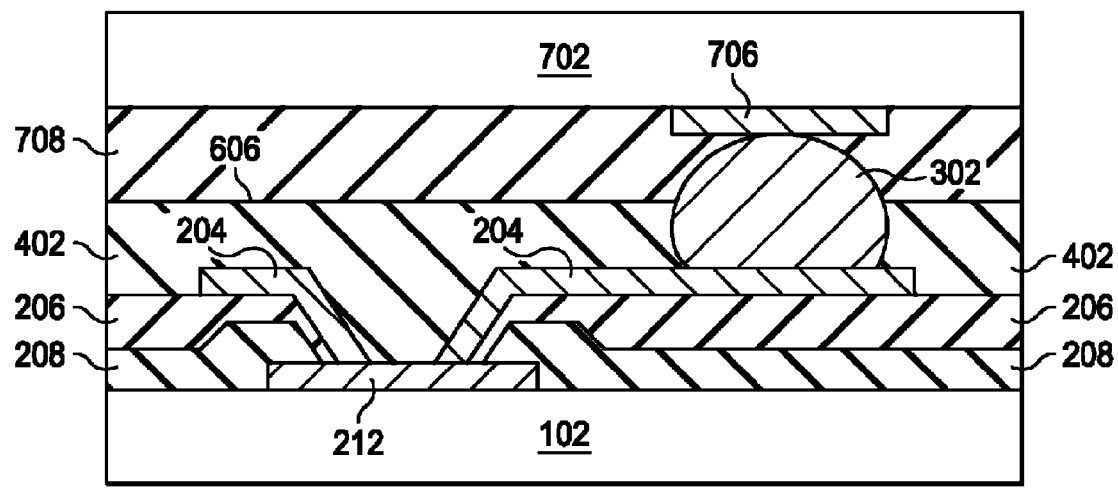

In an embodiment, the NCF 402 is molded over a lower portion of the connector 302 and so that an upper portion of the NCF 402 is exposed for bonding to a second, upper substrate (See 702 in FIG. 7). The NCF 402 is contoured to the body of the solidified connector 302 during application, molding and curing the NCF 402. The NCF 402 retains this shape during reflow. For example, where the connector 302 is a metal such as solder, the connector 302 may be reflowed to attach a second substrate. In such an example, the NCF 402 may confine the metal and prevent bridging between adjacent connectors 302 during the reflow process.

In some embodiments, the connector 302 has a sidewall angle 602 controlled relative to the NCF top surface 506. In an embodiment, a sidewall angle 602 is the angle between a connector sidewall tangent 604 and the NCF top surface 506. In an embodiment, the sidewall angle 602 is between about 65 degrees and about 135 degrees. The NCF support thickness 610 may be a height or thickness of the NCF 402 over the contact pad 212 or highest underlying structure adjacent to the connector 302. In an embodiment, the PPI 204 is part of a 2-mask substrate arrangement, where the passivation layers and the PPI 204 are each formed using a separate mask. The NCF support thickness 610 may be the distance between the NCF top surface 506 and the top surface of the PPI 204. In such an embodiment, the NCF support thickness 610 is between about 60 μm and about 350 μm. It has been discovered that an NCF support thickness 610 and a sidewall angle 602 within the aforementioned ranges provides a superior support and protection to the connector 302 while avoiding interference with the mounting of structures on the connector 302. The connector 302 may also extend laterally past the region where the connector 302 contacts the PPI 204 by an overhang distance 608 between about 10 μm and about 150 μm. The overhanging connector 302 results in the NCF 402 extending under a portion of the connector 302, and the NCF 402 contacting the PPI 204 under the connector 302 to a distance about equal to the overhang distance 608.

The NCF support thickness 610 and sidewall angle 602 may be determined or calculated based on the height of the connector 302. For example, a connector 302 with a height of 140 μm may have a radius of about 160 μm caused by the deformation of the connector 302 when applied to the PPI 204. An NCF 402 applied to such a connector 302 may have an NCF support thickness 610 of about 110 μm, resulting in a sidewall angle 602 of about 120 degrees and an exposed connector 302 portion with a height of about 30 μm.

A plasma cleaning process may optionally be applied to the connector 302. In an embodiment, the plasma clean process cleans the connector 302 and remove any residual release layer 404 or NCF 402 on the connector 302. The plasma clean process may also remove a portion of the top surface of the NCF 402. Therefore, the NCF 402 may be applied with an initial thickness thick enough to compensate for material loss due to the plasma clean. In an embodiment, the plasma clean process is an oxygen plasma, or the like, in an inert atmosphere such a nitrogen, argon, or the like. The plasma etch, in an embodiment, is performed with an etching bias between about 100 watts and about 250 watts, and in an embodiment, the power of the plasma etch is between about 400 watts and about 700 watts.

FIG. 7 is a cross-sectional view illustrating mounting of a second substrate 702 on the connector 302. The second substrate 702 may be mounted and the connector 302 activated to attach to the second substrate 702 thereby forming an electrical connection between the first substrate 102 and the second substrate 702. An underfill 708 may also be formed between the second substrate 702 and the NCF 402.

In one embodiment, the second substrate 702 has bond pads 706, which are joined to the connector 302. In an embodiment, the second substrate 702 is a die, wafer, interposer, or another electrical component. For example, the second substrate 702 is a memory die, while the first substrate 102 is a processor. In another embodiment, the second substrate 702 is a display, touch screen or input device, while the first substrate 102 is a processor.

Figure 8:
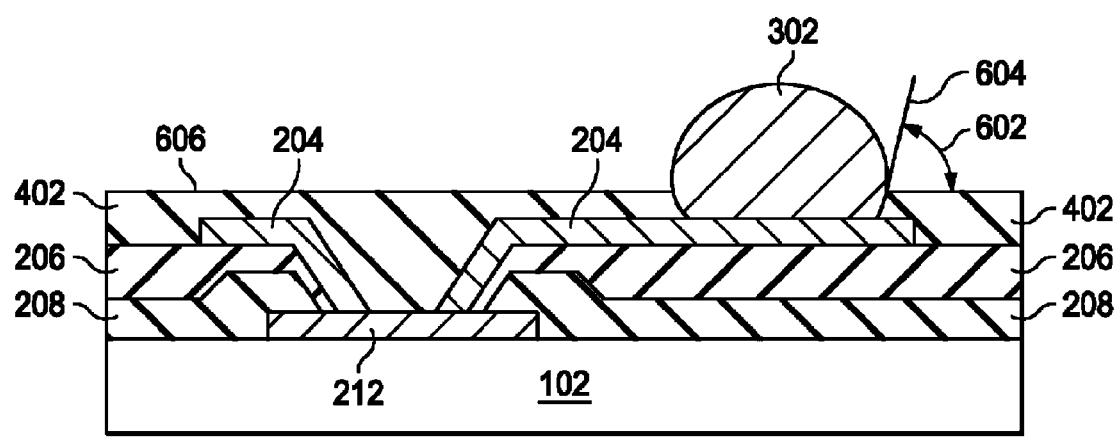
FIGS. 8 through 10 illustrate cross-sectional views of various embodiments of interconnects.

FIG. 8 is a cross sectional view illustrating an alternative embodiment of an NCF 402 formed over a connector 302 according to an embodiment. In such an embodiment, the NCF 402 has a NCF support thickness 610 selected to result in the NCF top surface 506 being lower than the widest portion of the connector 302. In such an embodiment, the sidewall angle 602 is between about 90 degrees and about 65 degrees.

Figure 9:
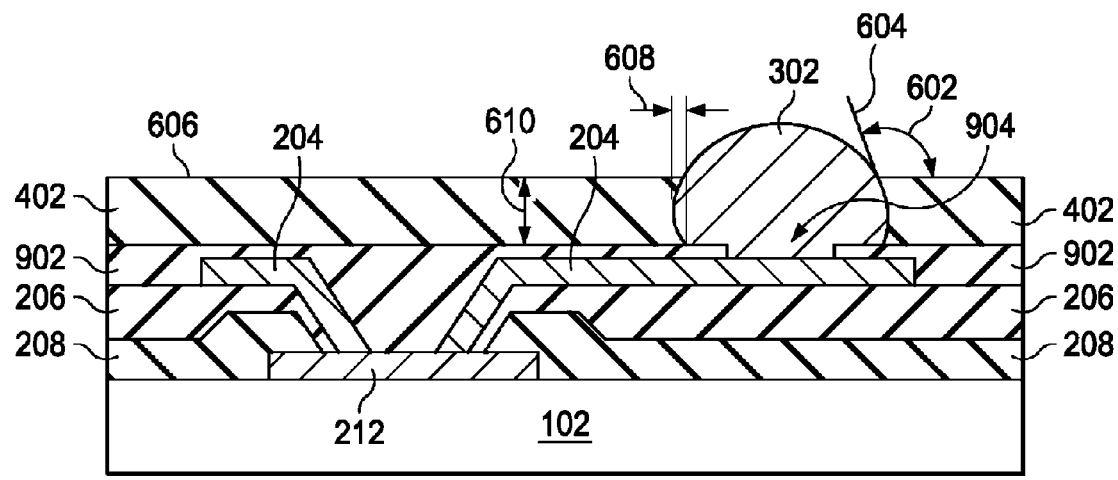

FIG. 9 is a cross sectional view illustrating an alternative embodiment of an NCF 402 formed over a connector 302 on a 3-mask substrate arrangement according to an embodiment. In such an embodiment, an insulating layer 902 is disposed on a portion of the PPI 204, with the passivation layers, the PPI 204 and the insulating layer 902 formed using separate masks. The connector 302 is in electrical contact with the PPI 204 through an opening 904 in the insulating layer 902. A portion of the connector 302 may be disposed on, or in contact with, the upper surface of the insulating layer 902. The insulating layer 902 may be a polyimide, dielectric or other insulating layer that is the same material or a different material than the second passivation layer 206.

In an embodiment, the NCF support thickness 610 is the distance between the NCF top surface 506 and the top surface of the insulating layer 902. The sidewall angle 602 is between about 65 degrees and about 135 degrees, the NCF support thickness 610 is between about 60 μm and about 350 μm and the overhang distance 608 is between about 10 μm and about 150 μm.

Figure 10:
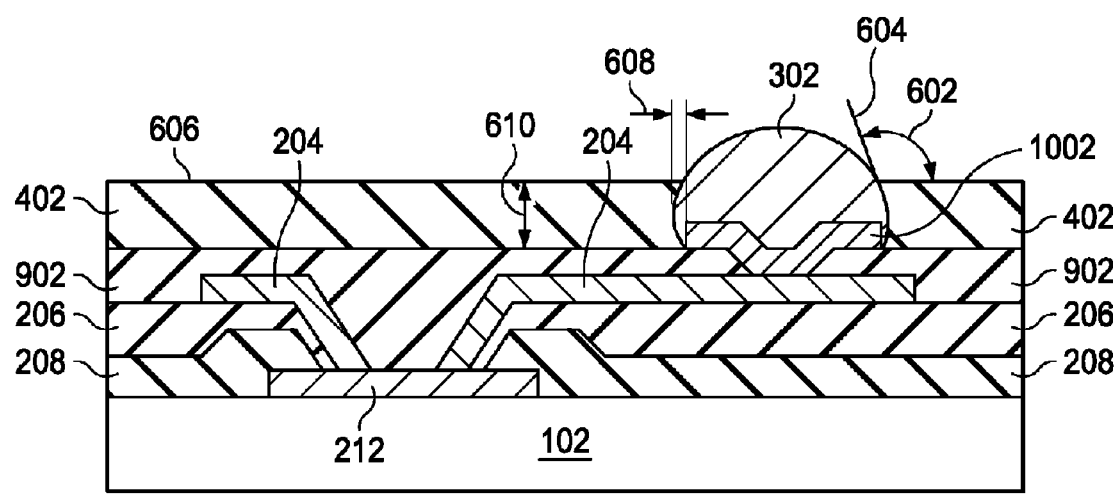

FIG. 10 is a cross sectional view illustrating an alternative embodiment of an NCF 402 formed over a connector 302 on a 4-mask substrate arrangement according to an embodiment. In such an embodiment, a land 1002, such as a mounting pad or under bump mount (UBM) is disposed over the second insulating layer and contacting the PPI 204, the land 1002, the passivation layers, and where the PPI 204 and insulating layer 902 are each formed using separate masks. The connector 302 is disposed on the land 1002 and in electrical contact with the PPI 204 by way of the land 1002.

In an embodiment, the NCF support thickness 610 is the distance between the NCF top surface 506 and the top surface of the insulating layer 902. The sidewall angle 602 is be between about 65 degrees and about 135 degrees, the NCF support thickness 610 is between about 60 μm and about 350 μm and the overhang distance 608 is between about 10 μm and about 150 μm.

Figure 11:
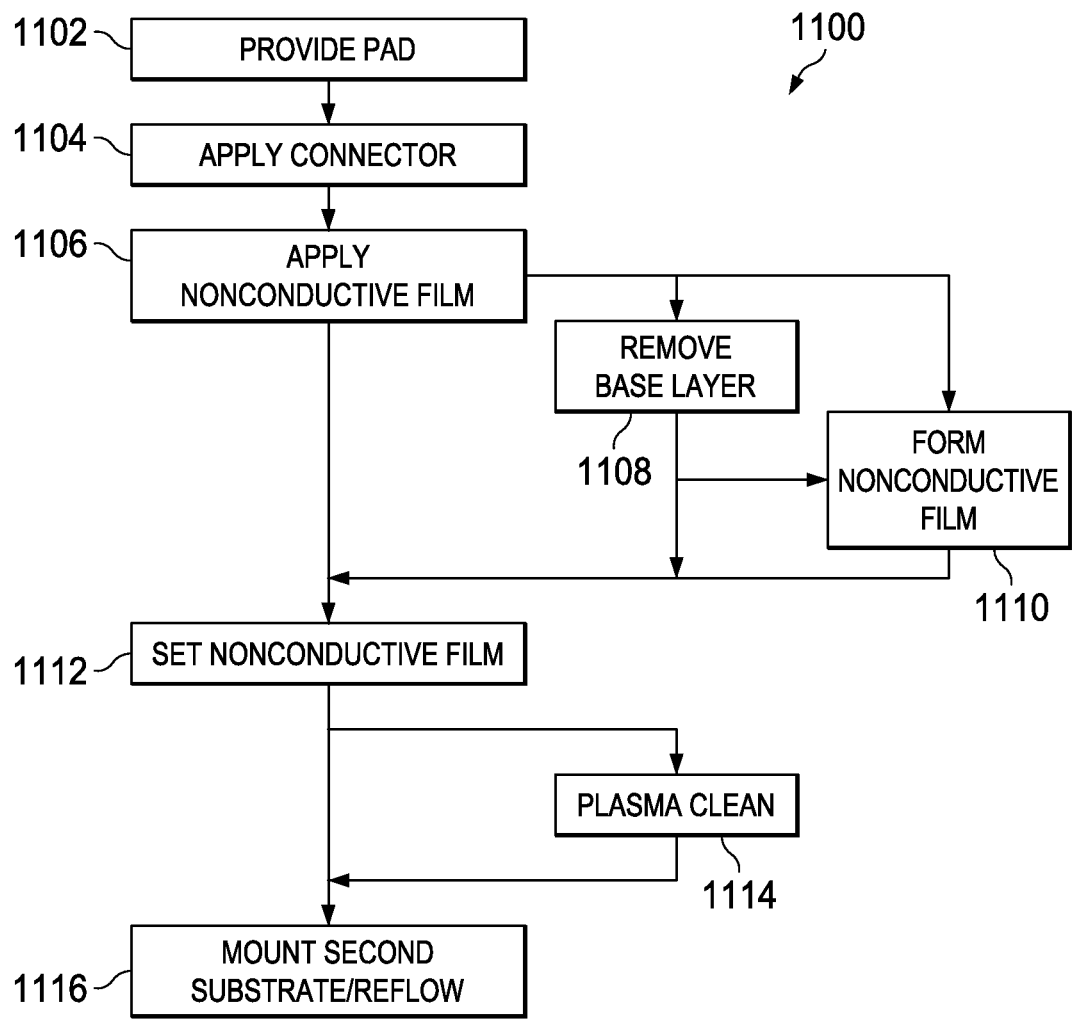
FIG. 11 is a flow diagram illustrating a method of forming an interconnect according to an embodiment.

FIG. 11 is a flow diagram illustrating a method 1100 for forming a connector 302 according to an embodiment. According to such an en embodiment, a PPI 204, optionally on a substrate 102 or other support structure, is provided in block 1102. Connector 302 is applied to the PPI 204 in block 1104. An NCF 402 is applied over the PPI 204 in block 1106, and the base layer 406 removed in block 1108. The NCF 402 is optionally molded or formed in block 1110. The NCF 402 is set or cured in block 1112, and a plasma clean optionally performed in block 1114. A second substrate 702 is, in block 1116, mounted on the connector 302 and affixed thereon via reflow or another connector 302 activation procedure.

Embodiments of an NCF surrounding connectors protect the connector shape and reduce the stress between the connectors and the underlying interconnect. Further, the NCF protects the underlying structures such as the PPI, the passivation layers, the contact pad, and the substrate from the stresses of later processing steps. This protection afforded by the NCF results in improved the reliability of the connector.

Thus, in an embodiment, a method of forming an interconnect comprises forming an connector on an interconnect disposed on a first surface of a first substrate and applying a nonconductive material in a non-liquid form over the interconnect after forming the connector, the nonconductive material covering at least a lower portion of the interconnect, at least a portion of the interconnect being exposed. The connector comprises a conductive material. The method may further comprise forming the nonconductive material around the connector by pressing the nonconductive material over the connector with a roller. The nonconductive material may be formed with a substantially flat top surface. Forming the nonconductive material further may comprise forming the nonconductive material with an angle between a top surface of the nonconductive material and a connector sidewall between about 65 degrees and about 135 degrees. Forming the nonconductive material may further comprise forming the nonconductive material with a thickness over the interconnect between about 60 μm and about 350 μm. Applying the nonconductive material comprises forming the conductive material to extend laterally past a region where the conductive material contacts the interconnect by an overhang distance between about 10 μm and about 150 μm. Forming the nonconductive material may comprise forming the nonconductive material to extend under the connector.

An embodiment of forming an interconnect comprises applying a connector on a mounting surface of an interconnect disposed on a first substrate, applying a nonconductive film over the interconnect, and forming the nonconductive film around the connector. An upper portion of the connector is exposed above of the nonconductive film. The nonconductive film may comprise a release layer. Forming the nonconductive film may comprise rolling the nonconductive film with a roller such that the nonconductive film conforms around connector. Forming the nonconductive film may comprise forming the nonconductive film to have a top surface with an angle to a sidewall of the connector between about 65 degrees and about 135 degrees. Forming the nonconductive film may comprise forming the nonconductive film to a thickness over the interconnect between about 60 μm and about 350 μm. Applying the connector may comprise forming the connector to extend laterally past a region where the connector contacts the interconnect by an overhang distance between about 10 μm and about 150 μm.

An embodiment of interconnect joint comprises a connector disposed on an interconnect of a first substrate, the connector connected to a land on a second substrate, the connector in contact with a mounting surface of the interconnect, and a nonconductive film disposed over a surface of the first substrate, and covering a portion of the connector, the nonconductive film exposing a portion of the connector. The nonconductive film has a substantially planar top surface. The interconnect may be part of a 2-mask first substrate configuration. The interconnect may be disposed on a passivation layer, and an insulating layer disposed over a portion of the interconnect, and the interconnect part of a 3-mask first substrate configuration. The interconnect may be disposed on a passivation layer, and an insulating layer disposed over a portion of the interconnect, the interconnect having a land disposed thereon and extending over a portion of the second insulating layer, the connector disposed on the land, the interconnect part of a 4-mask first substrate configuration. The nonconductive film may have a top surface with an angle to a sidewall of the connector between about 65 degrees and about 135 degrees. The nonconductive film may have a thickness over the interconnect between about 60 μm and about 350 μm. The connector may extend laterally past a region where the connector contacts the interconnect by an overhang distance between about 10 μm and about 150 μm.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, and composition of matter, means, methods or steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
   forming a passivation layer over a first substrate;
   forming an interconnect over the passivation layer;
   forming a conductive connector on the interconnect;
   applying a nonconductive film with a release layer to the passivation layer, the interconnect, and the conductive connector, the conductive connector being embedded within the nonconductive film;
   before the applying the nonconductive film with the release layer, removing a base layer from a first side of the nonconductive film, the release layer being on a second side of the nonconductive film, the second side being opposite the first side;
   pressing the nonconductive film with a roller, the roller rolling along a surface of the release layer, wherein after pressing, the conductive connector extends through the nonconductive film; and
   removing the release layer.

2. The method of claim 1, wherein the nonconductive film comprises an epoxy, a polymer, a resin, or insulator.

3. The method of claim 1, wherein after pressing the nonconductive film, the nonconductive film has a substantially planar top surface.

4. The method of claim 1 further comprising:
   bonding a bond pad of a second substrate to the conductive connector; and
   forming an underfill between the nonconductive film and the second substrate, the underfill surrounding and contacting an upper portion of the conductive connector, the nonconductive film surrounding and contacting a lower portion of the conductive connector.

5. The method of claim 1 further comprising:
   before the forming the conductive connector, forming an insulating layer over the interconnect;
   patterning the insulating layer to expose a portion of the interconnect;
   forming the conductive connector over the insulating layer and the interconnect, the conductive connector contacting the exposed portion of the interconnect and a top surface of the insulating layer; and
   applying the nonconductive film with the release layer over the conductive connector and the insulating layer.

6. The method of claim 1, wherein after pressing the nonconductive film with the roller, the nonconductive film has a substantially flat top surface.

7. The method of claim 1, wherein after pressing the nonconductive film with the roller, an angle between a top surface of the nonconductive film and a sidewall of the conductive connector is between 65 degrees and 135 degrees.

8. The method of claim 1, wherein after pressing the nonconductive film with the roller, the nonconductive film has a thickness over the interconnect between 60 μm and 350 μm.

9. The method of claim 1, wherein after pressing the nonconductive film with the roller, the nonconductive film extends directly under at least a portion of the conductive connector.

10. A method comprising:
    forming a passivation layer over a first substrate;
    forming a conductive interconnect over the passivation layer;
    forming a conductive connector on the conductive interconnect; and
    applying a nonconductive film in non-liquid form to the conductive interconnect and the conductive connector, wherein before the applying, the nonconductive film is in non-liquid form, wherein applying the nonconductive film further comprises:
       applying the nonconductive film further with a release layer to the passivation layer, the conductive interconnect, and the conductive connector, the conductive connector being embedded within the nonconductive film;
       pressing the nonconductive film with a roller, the roller rolling along a surface of the release layer, wherein after pressing the nonconductive film with the roller, the conductive connector extends through the nonconductive film, and wherein after pressing the nonconductive film with the roller, an angle between a top surface of the nonconductive film and a sidewall of the conductive connector is between 65 degrees and 135 degrees; and
       removing the release layer.

11. The method of claim 10, wherein before the applying the nonconductive film with the release layer, removing a base layer from a first side of the nonconductive film, the release layer being on a second side of the nonconductive film, the second side being opposite the first side.

12. The method of claim 10, wherein after pressing the nonconductive film, the nonconductive film has a substantially planar top surface.

13. The method of claim 10, wherein the nonconductive film comprises an epoxy, a polymer, a resin, or insulator.

14. The method of claim 10 further comprising:
    bonding a bond pad of a second substrate to the conductive connector; and
    forming an underfill between the nonconductive film and the second substrate, the underfill surrounding and contacting an upper portion of the conductive connector, the nonconductive film surrounding and contacting a lower portion of the conductive connector.

15. The method of claim 10 further comprising:
    before the forming the conductive connector, forming an insulating layer over the conductive interconnect;
    patterning the insulating layer to expose a portion of the conductive interconnect;
    forming the conductive connector over the insulating layer and the conductive interconnect, the conductive connector contacting the exposed portion of the conductive interconnect and a top surface of the insulating layer; and
    applying the nonconductive film with the release layer over the conductive connector and the insulating layer.

16. The method of claim 10, wherein the conductive interconnect comprises copper, and wherein the conductive connector comprises solder.

17. A method comprising:
    forming a passivation layer over a first substrate;
    forming a conductive interconnect over the passivation layer;

forming an insulating layer over the conductive interconnect;

patterning the insulating layer to expose a portion of the conductive interconnect;

forming a conductive connector over the insulating layer and the conductive interconnect, the conductive connector contacting the exposed portion of the conductive interconnect and a top surface of the insulating layer;

applying a nonconductive film with a release layer to the insulating layer and the conductive connector, the conductive connector being embedded within the nonconductive film;

before the applying the nonconductive film with the release layer, removing a base layer from a first side of the nonconductive film, the release layer being on a second side of the nonconductive film, the second side being opposite the first side;

rolling a roller along a surface of the release layer, wherein after the rolling, the conductive connector extends through the nonconductive film; and removing the release layer.

18. The method of claim 17, wherein the conductive interconnect comprises copper, and wherein the conductive connector comprises solder.

19. The method of claim 17, wherein after the rolling the roller along the surface of the release layer, the nonconductive film has a substantially planar top surface.

20. The method of claim 17, wherein after the rolling the roller along the surface of the release layer, an angle between a top surface of the nonconductive film and a sidewall of the conductive connector is between 65 degrees and 135 degrees.

* * * * *